US007982647B2

(12) United States Patent
Souda

(10) Patent No.: US 7,982,647 B2
(45) Date of Patent: Jul. 19, 2011

(54) DELTA-SIGMA A/D CONVERTER

(75) Inventor: Masaaki Souda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/659,343

(22) Filed: Mar. 4, 2010

(65) Prior Publication Data

US 2010/0245147 A1    Sep. 30, 2010

(30) Foreign Application Priority Data

Mar. 31, 2009   (JP) .................................. 2009-084783

(51) Int. Cl.
*H03M 3/00* (2006.01)
(52) U.S. Cl. ...................... 341/143; 341/155; 341/144
(58) Field of Classification Search .................. 341/144, 341/143, 155, 120, 118, 119
See application file for complete search history.

(56) References Cited

U.S. PATENT DOCUMENTS 7,495,593 B2 *  2/2009  Wang ............................ 341/143
7,545,301 B2 *  6/2009  Kim et al. ...................... 341/143

FOREIGN PATENT DOCUMENTS

JP    2006-41992 A    2/2006

OTHER PUBLICATIONS

Shouli Van and Edgar Sanchez-Sinencio, "A Continuous-Time ΣΔModulator With 88-dB Dynamic Range and 1.1-MHz Signal Bandwidth," IEEE Jouirnal of Solid-State Circuits, Jan. 2004, vol. 39, No. 1, p. 75-86.

* cited by examiner

*Primary Examiner* — Brian Young
(74) *Attorney, Agent, or Firm* — McGinn IP Law Group, PLLC

(57) ABSTRACT

An object of the present invention is to provide a highly accurate delta sigma A/D converter. Disclosed is a delta sigma A/D converter including: a first integration circuit to generate a first signal on the basis of an input signal and a first feedback signal from an output side; a first signal conversion circuit to convert the first signal into a first converted signal; a loop delay compensation circuit to generate a compensation signal and then to output the compensation signal in response to a second feedback signal fed back from the output side at a timing earlier than that of the first feedback signal; an adder circuit to add the first converted signal and the compensation signal; and a comparator to generate a digital signal on the basis of an output signal from the adder circuit. The loop delay compensation circuit includes a compensation signal conversion circuit to generate the compensation signal. The compensation signal conversion circuit and the first signal conversion circuit have the approximately same rate of change in conversion coefficient depending on a temperature.

10 Claims, 6 Drawing Sheets

DELTA-SIGMA A/D CONVERTER

TECHNICAL FIELD

The present invention relates to a delta-sigma A/D converter, and more particularly, to a continuous-time delta-sigma A/D converter.

BACKGROUND ART

Having complicated circuits and a large number of component parts, a highly accurate analog/digital (A/D) converter requires increases in circuit area and power consumption. In recent years, a delta sigma (ΔΣ) A/D converter achieving high accuracy by an over sampling technique in spite of a small number of component parts has been actively developed, and thus various circuit systems have been studied. Generally a ΔΣ A/D converter feeds back a converted digital output signal to an analog input signal and then modulates frequency characteristics thereby to secure a desired conversion band and accuracy. The ΔΣ A/D converter requires a high speed clock rate dozens of times as high as the converted signal bandwidth, and thereby requires circuits to operate at such a high speed. In this regard, such high speed circuits have been put in practical use thanks to speed-up of MOS transistors.

A configuration example of a ΔΣ A/D converter is disclosed in FIG. 1 of Patent Literature 1. In the ΔΣ A/D converter, a quantizer is connected to an output of a filter circuit constituted of multiple integration circuits. An output signal of the quantizer is outputted via an encoder and is also fed back to the filter circuit via a D/A converter.

Here, the ΔΣ A/D converter disclosed in Patent Literature 1 is a discrete-time type. Meanwhile, attention has been attracted to a continuous-time type which achieves lower power consumption than the discrete-time type, and which is also suitable for a high-speed high-frequency signal. The continuous-time ΔΣ A/D converter is configured based on the assumption that an excess loop delay (ELD) from the sampling of the output signal of the quantizer until the feedback of the signal to the filter circuit is almost zero. However, when the sampling clock rate is high, the ELD can be no longer ignored.

A configuration in which the ELD is compensated is disclosed in FIG. 2 of Non-patent Literature 1. FIG. 6 attached hereto is a block diagram of a continuous-time ΔΣ A/D converter disclosed in FIG. 2 of Non-patent Literature 1. The continuous-time ΔΣ A/D converter includes adder circuits 1 to 3, integration circuits 4 to 6, voltage-current conversion circuits K4 to K7 and Kz, an internal A/D converter (ADC), two D/A converters (DACs) -A and -B, and two D-latches (D-LATCHes).

In the continuous-time ΔΣ converter, an analog input signal IN and output signals of the integration circuits 4 to 6 are converted into current signals by the voltage-current conversion circuits K4 to K7, respectively, and the currents are added in the adder circuit 3 positioned at a prior stage of the internal ADC. In other words, this continuous-time ΔΣ converter is a feedforward type.

The internal ADC, which is a quantizer, converts an output signal of the adder circuit 3 into a 5-bit digital value and outputs a digital output signal OUT. The DAC-A feed backs an analog current in response to the digital output signal OUT to the adder circuit 1. In addition, the DAC-B feed backs an analog current in response to the digital output signal OUT to the adder circuit 3. Thereby, delay compensation of the internal ADC is performed.

Here, a delay time of the output signal OUT of the internal A/D converter ADC largely fluctuates due to the amplitude or the like of a signal inputted from the adder circuit 3. In order to reduce the amount of fluctuation, the output signal OUT of the internal ADC is fed back to the DAC-A via the two D-LATCHes.

Meanwhile, the feedback from the output signal OUT to the input signal IN is constantly delayed by one clock cycle, and the feedback is not performed during a period from a sampling timing to the next sampling timing. The DAC-B is provided to compensate this problem. The DAC-B receives the output signal OUT only a half clock cycle earlier than the DAC-A, and performs feedback to the adder circuit 3 immediately before the internal ADC.

Unlike the signal from the DAC-A, the signal from the DAC-B is not inputted to the integration circuits 3 to 6. Thus, the influence of the feedback by the DAC-B is limited in the period from the sampling timing to the next sampling timing at which the feedback of the DAC-A is not performed. Accordingly, even when the DAC-A and DAC-B are used in a combination, the system operates without any problem. Here, the feedback coefficient of the DAC-B can be calculated by using an impulse response equalization method.

[Citation List]
[Patent Literatures]
[Patent Literature 1] Japanese Patent Application Publication No. 2006-41992
[Non-patent Literature 1] Yan, S. and one other, "A continuous-time ΣΔ modulator with 88-dB dynamic range and 1.1-MHz signal bandwidth," IEEE Journal of Solid-State Circuits, January 2004, Vol. 39, No. 1, p. 75-86

SUMMARY

[Technical Problems]

In Non-patent Literature 1, a current switch circuit similar to the DAC-A is used as the DAC-B. Here, the addition coefficients of the voltage-current conversion circuits K4 to K7 change with a change in the temperature. However, in Non-patent Literature 1, the output current from the DAC-B is not changed according to conversion characteristics of the voltage-current conversion circuits K4 to K7. Thus, the compensation coefficient deviates from the design value, and there arises a problem that the accuracy as the entire continuous-time ΔΣ A/D converter is rather degraded.

[Solution to Problem]

A delta sigma A/D converter according to the present invention includes: a first integration circuit to generate a first signal on the basis of an input signal and a first feedback signal from an output side; a first signal conversion circuit to convert the first signal into a first converted signal; a loop delay compensation circuit to generate a compensation signal and to output the compensation signal in response to a second feedback signal fed back from the output side at a timing earlier than that of the first feedback signal; an adder circuit to add the first converted signal and the compensation signal; and a comparator to generate a digital signal on the basis of an output signal from the adder circuit. In the delta sigma A/D converter, the loop delay compensation circuit includes a compensation signal conversion circuit that generates the compensation signal, and the compensation signal conversion circuit and the first signal conversion circuit have the approximately same rate of change in conversion coefficient depending on a temperature.

A highly accurate delta sigma A/D converter can be provided because the compensation signal conversion circuit and the first signal conversion circuit have the approximately same rate of change in conversion coefficient depending on a temperature.

[Advantageous Effect of Invention]

According to the present invention, a highly accurate delta sigma A/D converter can be provided.

DESCRIPTION OF EMBODIMENTS

Hereinafter, with reference to the drawings, a description will be given in detail of specific embodiments to which the present invention is applied. However, the present invention is not limited to the embodiments below. Further, for the purpose of clarifying the description, the description and drawings below are simplified as appropriate.

First Embodiment

Figure 1:
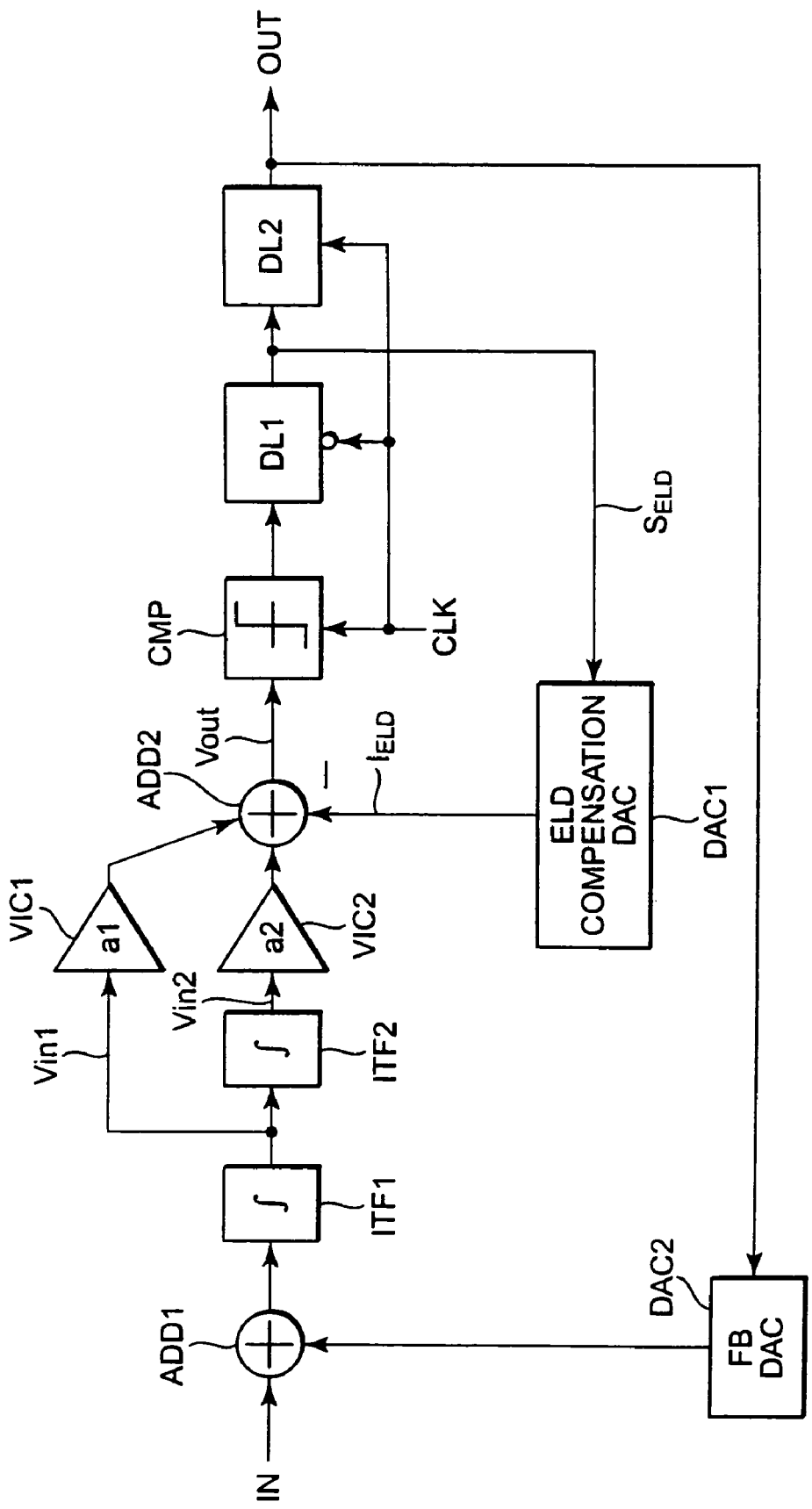
FIG. 1 is a block diagram of a delta sigma A/D converter according to a first embodiment.

FIG. 1 is a block diagram of a continuous-time $\Delta\Sigma$ A/D converter according to a first embodiment of the present invention. The continuous-time $\Delta\Sigma$ A/D converter includes two integration circuits ITF1 and ITF2, two adder circuits ADD1 and ADD2, two voltage-current conversion circuits VIC1 and VIC2, a comparator CMP, an ELD compensation D/A converter DAC1, a feedback D/A converter DAC2 and two D latches DL1 and DL2. Note that, although the description is given of a case where two integration circuits are employed as an example, the number of integration circuits, adder circuits or the like is optional.

The adder circuit ADD1 adds an input signal IN and a feedback signal (first feedback signal) converted by the feedback D/A converter DAC2 into an analog signal from an output signal OUT.

The integration circuit ITF1 (first integration circuit) integrates a signal outputted from the adder circuit ADD1 and then outputs an input voltage signal Vin1 (first signal). The input voltage signal Vin1 is converted into a current (first converted current) via the voltage-current conversion circuit VIC1 (first signal conversion circuit) and is then feed forwarded to the adder circuit ADD2.

The integration circuit ITF2 (second integration circuit) integrates the input voltage signal Vin1 outputted from the integration circuit ITF1 and then outputs an input voltage signal Vin2 (second signal). The input voltage signal Vin2 is converted into a current (second converted signal) via the voltage-current conversion circuit VIC2 (second signal conversion circuit) and is then inputted to the adder circuit ADD2.

The adder circuit ADD2 adds the currents outputted from the aforementioned voltage-current conversion circuits VIC1 and VIC2, respectively, and an ELD compensation current $I_{ELD}$ (compensation signal) fed back from the ELD compensation D/A converter DAC1 and then outputs an output voltage signal Vout.

The comparator CMP quantizes the output voltage signal Vout outputted from the adder circuit ADD2. Here, the comparator CMP according to the present embodiment performs sampling at a rising edge of a clock signal CLK.

The D latch DL1 latches data at a clock edge reversal to the comparator CMP. In addition, the D latch DL2 latches data at the same clock edge as the comparator does. An output signal OUT is outputted from the D latch DL2.

The ELD compensation D/A converter (loop delay compensation circuit) DAC1 generates the ELD compensation current $I_{ELD}$ on the basis of a digital signal (second feedback signal) fed back from the D latch DL1 and then outputs the ELD compensation current $I_{ELD}$ to the adder circuit ADD2.

The feedback D/A converter DAC2 generates a feedback signal on the basis of the output signal OUT and then outputs the feedback signal to the adder circuit ADD1.

Figure 2:
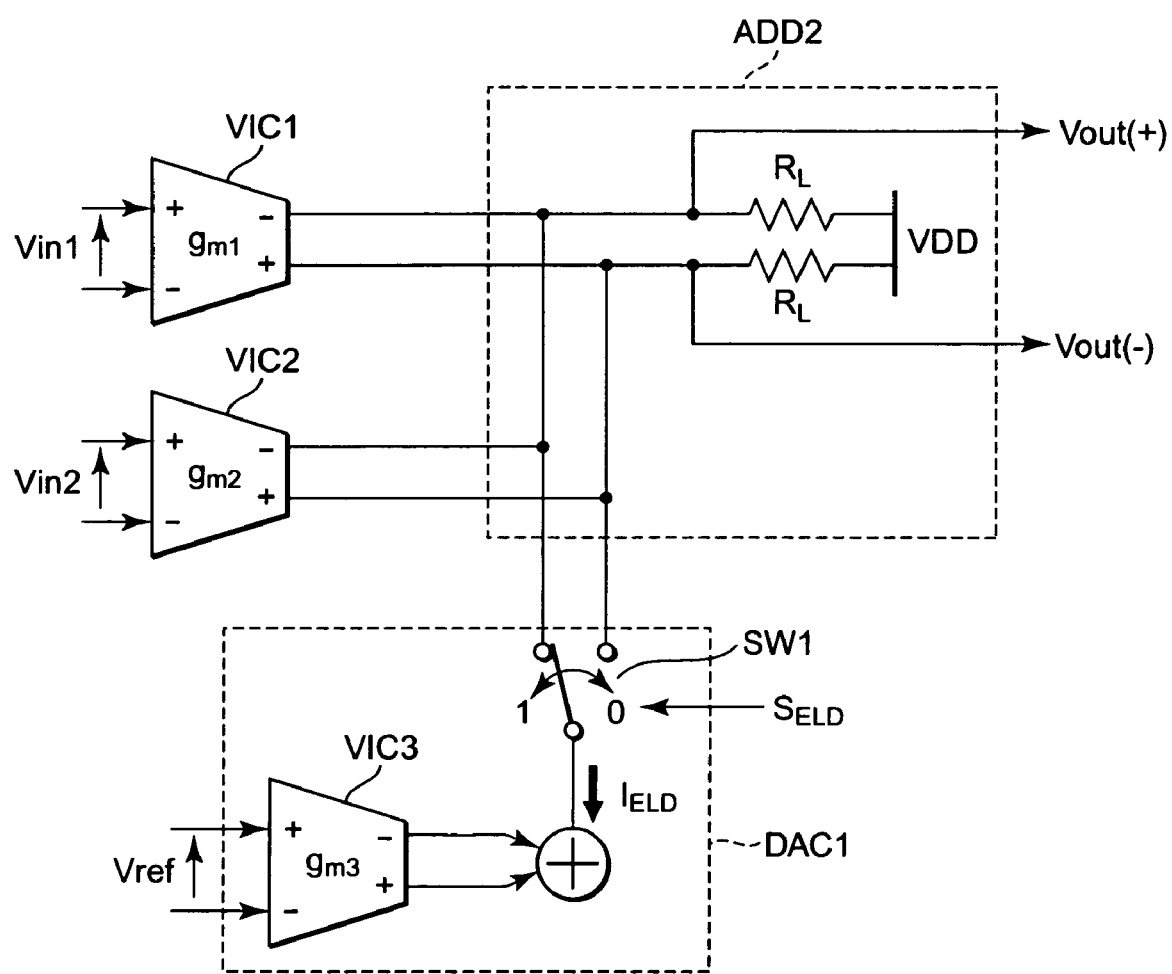
FIG. 2 is a circuit diagram of an ELD compensation D/A converter DAC 1 according to the first embodiment and a periphery thereof.

FIG. 2 is a circuit diagram of the voltage-current conversion circuits VIC1 and VIC2, the adder circuit ADD2 and the ELD compensation D/A converter DAC1 which are shown in FIG. 1. Here, the ELD compensation D/A converter DAC1 includes a differential switch circuit SW1 and a voltage-current conversion circuit VIC3 (compensation signal conversion circuit).

As shown in FIG. 2, both (+) and (−) output terminals of the voltage-current conversion circuit VIC1 are connected to a power supply VDD via load resistances $R_L$, respectively. Likewise, both (+) and (−) output terminals of the voltage-current conversion circuit VIC2 are connected to the power supply VDD via the load resistances $R_L$, respectively. In addition, the (+) output terminals of the voltage-current conversion circuits VIC1 and VIC2 are connected to each other, and the (−) output terminals thereof are connected to each other as well. Then, a differential output voltage signal Vout (+) is outputted from a node between the (−) output terminals of the voltage-current conversion circuits VIC1 and VIC2 and the load resistance $R_L$. In addition, a differential output voltage signal Vout (−) is outputted from a node between the (+) output terminals of the voltage-current conversion circuits VIC1 and VIC2 and the load resistance $R_L$.

Here, the differential input voltage signals Vin1 and Vin2 outputted from the integration circuits ITF1 and ITF2 are converted into differential current signals by the voltage-current conversion circuits VIC1 and VIC2, respectively. Then, the currents of the (−) output terminals are added to each other, and the currents of the (+) output terminals are added to each other. Each of the added currents is converted into a voltage signal by a corresponding one of the load resistances $R_L$. Then, the voltage signals are outputted as the differential output voltage signals Vout (+) and Vout (−), respectively.

In a case where the voltage of the (+) input terminal is higher than the voltage of the (−) input terminal, a current is outputted from the (−) output terminal in the voltage-current conversion circuits VIC1 and VIC2 and then is absorbed into the (+) output terminal of the adder circuit ADD2. Specifically, when the differential input voltage signal Vin1 of the voltage-current conversion circuit VIC1 is positive, the output voltage signal Vout (+) increases, and the output voltage signal Vout (−) decreases.

The voltage-current conversion circuit VIC3 has the same configuration as those of the voltage-current conversion circuits VIC1 and VIC2. An ELD reference voltage Vref for ELD compensation is inputted to the input terminal of the voltage-current conversion circuit VIC3. The value of the reference voltage Vref is set in order that impulse responses of the filters in the ΔΣ A/D converter can be equal, and is uniquely determined from the range of the input signal IN. In other words, the reference voltage Vref is not related to the characteristic values of the voltage-current conversion circuits VIC1 to VIC3.

The ELD reference voltage Vref (reference signal) is converted into a differential current signal by the voltage-current conversion circuit VIC3. Here, a current of the (+) output terminal and a current of the (−) output terminal are added, and an ELD compensation current $I_{ELD}$ is generated. Here, the differential switch circuit SW1 switches a connection destination of the ELD compensation current $I_{ELD}$ in accordance with an output signal $S_{ELD}$ of the D latch DL1. Thus, the ELD compensation current $I_{ELD}$ is added to the added current of the (−) output terminals of the voltage-current conversion circuits VIC1 and VIC2, or the added current of the (+) output terminals thereof. Thereby, the output voltage signal Vout is corrected. Specifically, the comparator CMP outputs "1" when the differential output voltage signal Vout of the adder circuit ADD2 is positive, and outputs "0" when the differential output voltage signal Vout thereof is negative. Then, when the output signal $S_{ELD}$ of the D latch DL1=1, the ELD compensation D/A converter DAC1 operates to draw the ELD compensation current $I_{ELD}$ from the output voltage signal Vout (+) side and thereby to lower the output voltage signal Vout (+). On the other hand, when the output signal $S_{ELD}$ of the D latch DL1=0, the ELD compensation D/A converter DAC1 operates to draw the ELD compensation current $I_{ELD}$ from the output voltage signal Vout (−) side and thereby to lower the output voltage signal Vout (−). In other words, the ELD compensation D/A converter DAC1 performs negative feedback in the negative direction when the output voltage signal Vout of the adder circuit ADD2 is positive, and performs negative feedback in the positive direction when the output voltage signal Vout of the adder circuit ADD2 is negative on the other hand. Here, the amount of feedback is determined by the ELD compensation current $I_{ELD}$.

Next, a description will be given of the principle of the present embodiment by using mathematical formulas. In a case where the ELD compensation D/A converter DAC1 of FIG. 1 is provided, the adder circuit ADD2 satisfies the following formula (1).

$$Vout = a1 \cdot Vin1 + a2 \cdot Vin2 - A_{ELD} \cdot s \quad (1)$$

In the formula (1), a1 and a2 are the output addition coefficients of the integration circuits ITF1 and ITF2, respectively; and $A_{ELD}$ is the ELD compensation coefficient. Moreover, s is the value in accordance with the output signal $S_{ELD}$ of the D latch DL1 and is either 1 or −1. Specifically, when the output voltage signal Vout of the adder circuit ADD2 is positive, that is, when $S_{ELD}$=1, s=1, and when the output voltage signal Vout of the adder circuit ADD2 is negative, that is, when $S_{ELD}$=0, S=−1.

Figure 3:
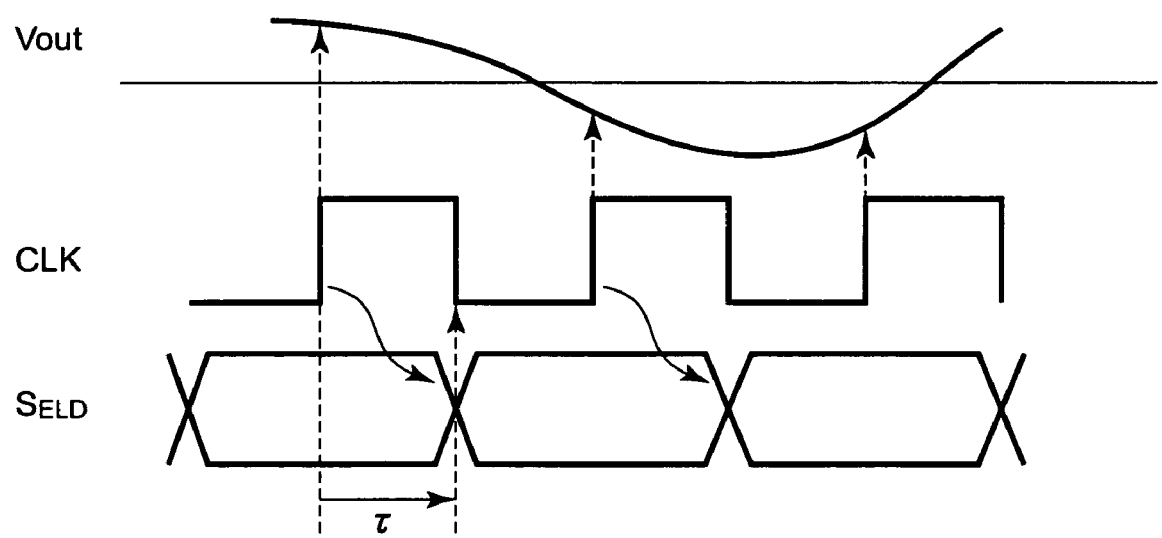
FIG. 3 is a timing chart showing an operation of the delta sigma A/D converter according to the first embodiment.

Further, as shown in FIG. 3, the output voltage signal Vout of the adder circuit ADD2 is subjected to sampling at a rising edge of the clock signal CLK by the comparator CMP. Then, the output signal $S_{ELD}$ of the D latch DL1 is outputted after time τ passes from this sampling. The values of the output addition coefficients a1 and a2, and the ELD compensation coefficient $A_{ELD}$ are determined by the time τ. Here, the value of the time τ is often set to be a half clock cycle for the purpose of easier implementation as the circuit.

Next, the following formula (2) is obtained when the formula (1) is applied to FIG. 2.

$$Vout = R_L \cdot (g_{m1} \cdot (Vin1p - Vin1n) + g_{m2} \cdot (Vin2p - Vin2n) - g_{m3} \cdot (Vrefp - Vrefn) \cdot s) \quad (2)$$

Here, the Vin1p and Vin1n are the voltages given to the (+) input terminal and the (−) input terminal of the voltage-current conversion circuit VIC1, respectively. Voltages are given to the Vin2p, Vin2n, Vrefp and Vrefn in the same manner. Here, the followings are true: Vin1=Vin1p−Vin1n, Vin2=Vin2p−Vin2n, and Vref=Vrefp−Vrefn. In addition, as compared with the formula (1), the followings are true: a1=$g_{m1} \cdot R_L$, a2=$g_{m2} \cdot R_L$, and $A_{ELD}$=$g_{m3} \cdot R_L \cdot$Vref. Accordingly, the values of the conversion coefficients $g_{m1}$, $g_{m2}$ and $g_{m3}$ of the voltage-current conversion circuits VIC1, VIC2 and VIC3 and the ELD reference voltage Vref may be set to appropriate values, respectively.

Here, the conversion coefficients $g_{m1}$ and $g_{m2}$ of the voltage-current conversion circuits VIC1 and VIC2 are determined by the characteristics of transistors and are changed by the temperature or characteristic variations of the transistors. Thus, the amount of compensation of the ELD compensation D/A converter DAC1 by the ELD reference voltage Vref needs to be changed in accordance with the characteristic variations of the conversion coefficients $g_{m1}$ and $g_{m2}$.

In this embodiment, the voltage-current conversion circuit VIC3 has the same circuit configuration as those of the voltage-current conversion circuits VIC1 and VIC2, so that the conversion coefficient $g_{m3}$ in the formula (2) changes in the same manner as the conversion coefficients $g_{m1}$ and $g_{m2}$. In other words, even when the temperature changes, the ratio among the conversion coefficients $g_{m1}$, $g_{m2}$ and $g_{m3}$ is constant. Hereinafter, a description will be given in detail of this point.

The ratio among the conversion coefficients $g_{m1}$, $g_{m2}$ and $g_{m3}$ of the voltage-current conversion circuits VIC1, VIC2 and VIC3 is determined by a ratio among gate widths of gate terminals of MOS transistors to which voltage signals are inputted in the respective voltage-current conversion circuits VIC1, VIC2 and VIC3.

In addition, provided that the values of the conversion coefficients $g_{m1}$, $g_{m2}$ and $g_{m3}$ at a temperature T0 are set to $g_{m10}$, $g_{m20}$ and $g_{m30}$, respectively, and the values of the conversion coefficients $g_{m1}$, $g_{m2}$ and $g_{m3}$ at a temperature T1 are set to $g_{m11}$, $g_{m21}$ and $g_{m31}$, respectively, the following formula (3) is established.

$$g_{m11} = \alpha_1 g_{m10}$$

$$g_{m21} = \alpha_2 g_{m20}$$

$$g_{m31} = \alpha_3 g_{m30} \quad (3)$$

Here, $\alpha_1$, $\alpha_2$ and $\alpha_3$ are change rates of the conversion coefficients $g_{m1}$, $g_{m2}$ and $g_{m3}$ due to the temperature and are positive real numbers.

Here, the change rates $\alpha_1$, $\alpha_2$ and $\alpha_3$ in the voltage-current conversion circuits VIC1, VIC2 and VIC3 are designed so that the change rates can be values substantially equal to each other. Specifically, $\alpha_1 = \alpha_2 = \alpha_3 = \alpha$ is true. Accordingly, the ratio among the conversion coefficients $g_{m1}$, $g_{m2}$ and $g_{m3}$ can be kept constant even when the temperature changes. Note that, in this embodiment, the MOS transistors to which voltage signals are inputted in the respective voltage-current conversion circuits VIC1, VIC2 and VIC3 have only the different gate widths of the gate terminals thereof.

Here, when the output voltage signal Vout at the temperature T0 is set to Vout$_0$, and the output voltage signal Vout at the temperature T1 is set to Vout$_1$, the following formula (4) is obtained from the formulas (2) and (3).

$$\text{Vout}_1 = \alpha \text{Vout}_0 \quad (4)$$

The output voltage signal Vout of the adder circuit ADD2 is the input signal of the comparator CMP and only matters if the value thereof is positive or negative. In the formula (4), α is a positive real number, and there is no change between positive and negative of the Vout$_0$ and Vout$_1$. Thus, a change of the temperature has no influence on the accuracy of the ΔΣ A/D converter. As described above, according to the present embodiment, the ELD compensation can be performed while a high accuracy as the ΔΣ A/D converter can be maintained against a change of the temperature.

Figure 4:
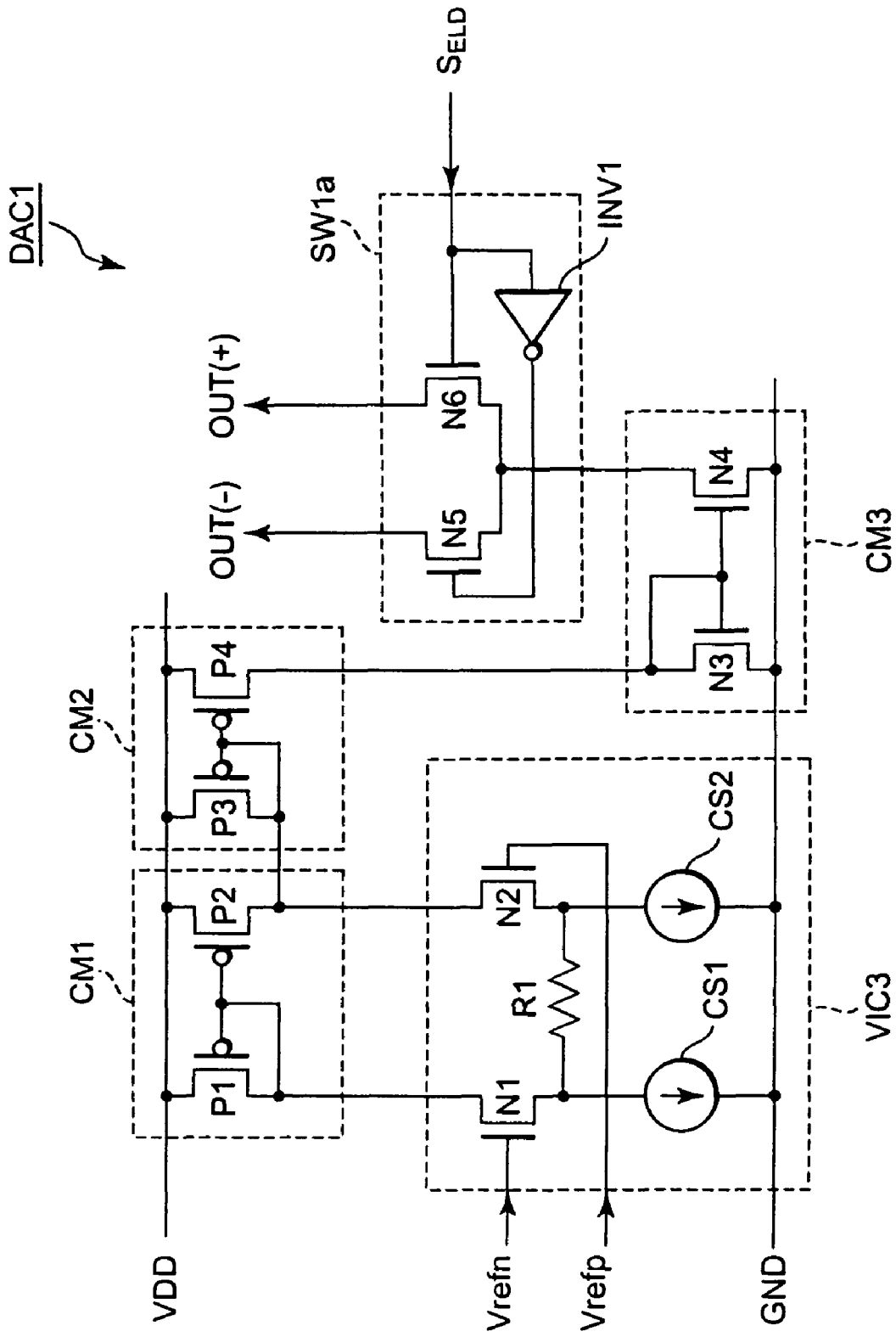
FIG. 4 is an example of a specific circuit configuration using transistors of the ELD compensation D/A converter DAC 1 according to the first embodiment.

FIG. 4 shows an example of a specific circuit configuration using transistors of the ELD compensation D/A converter DAC1 according to the first embodiment. The ELD compensation D/A converter DAC1 includes: the voltage-current conversion circuit VIC3 having the same configuration as those of the voltage-current conversion circuits VIC1 and VIC2; current mirrors CM1, CM2 and CM3; and a differential switch circuit SW1a.

As shown in FIG. 4, the voltage-current conversion circuit VIC3 includes current sources CS1 and CS2, NMOS transistors N1 and N2, and a resistance R1. One ends of the current sources CS1 and CS2 are both grounded. The other ends of the current sources CS1 and CS2 are connected to sources of the NMOS transistors N1 and N2, respectively, and are also connected to each other via the resistance R1. Drains of the NMOS transistors N1 and N2 are connected to drains of PMOS transistors P1 and P2, respectively, the PMOS transistors P1 and P2 constituting the current mirror CM1. The ELD reference voltages Vrefn and Vrefp are given to gates of the NMOS transistors N1 and N2, respectively.

The current mirror CM1 is constituted of the PMOS transistors P1 and P2. Sources of the PMOS transistors P1 and P2 are both connected to a power supply VDD. Gates of the PMOS transistors P1 and P2 are connected to each other and also connected to the drain of the PMOS transistor P1.

The current mirror CM2 is constituted of PMOS transistors P3 and P4. Sources of the PMOS transistors P3 and P4 are both connected to the power supply VDD. Gates of the PMOS transistors P3 and P4 are connected to each other and also connected to a drain of the PMOS transistor P3 and to the drain of the PMOS transistor P2, which is one of the constituent elements of the current mirror CM1. A drain of the PMOS transistor P4 is connected to a drain of an NMOS transistor N3, which is one of the constituent elements of the current mirror CM3.

The current mirror CM3 is constituted of the NMOS transistor N3 and a transistor N4. Sources of the NMOS transistors N3 and N4 are both grounded. Gates of the NMOS transistors N3 and N4 are connected to each other and also connected to the drain of the NMOS transistor N3. Drain of the NMOS transistor N4 is connected commonly to sources of NMOS transistors N5 and N6, which form the differential switch circuit SW1a.

The differential switch circuit SW1a is constituted of the NMOS transistors N5 and N6 and an inverter INV1. Drains of the NMOS transistors N5 and N6 are connected to the outputs OUT (−) and OUT (+) of the ELD compensation D/A converter DAC1, respectively. An inverted signal of the output signal S$_{ELD}$ of the D latch DL1 by the inverter INV1 is inputted to a gate of the NMOS transistor N5. The output signal S$_{ELD}$ of the D latch DL1 is inputted to a gate of the NMOS transistor N6.

Specifically, when the output signal S$_{ELD}$ of the D latch DL1=1, the NMOS transistor N5 is turned off, and the NMOS transistor N6 is turned on. On the other hand, when the output signal S$_{ELD}$ of the D latch DL1=0, the NMOS transistor N5 is turned on, and the NMOS transistor N6 is turned off.

Next, a description will be given of an operation. A current difference due to the ELD reference voltages Vref (Vrefp, Vrefn) occurs in the differential output of the voltage-current conversion circuit VIC3. The current difference in the differential is inputted to the current mirror CM2 via the current mirror CM1. The output current of the current mirror CM2 is further replicated by the current mirror CM3. Then, the output destination of the output current of the current mirror CM3 is switched to any one of the output OUT (+) and the output OUT (−) of the ELD compensation D/A converter DAC1 by the differential switch circuit SW1a.

In this embodiment, the voltage-current conversion circuit VIC3 has the same configuration as those of the voltage-current conversion circuits VIC1 and VIC2. Accordingly, the conversion coefficient g$_{m3}$ of the voltage-current conversion circuit VIC3 fluctuates, as the conversion coefficients g$_{m1}$ and g$_{m2}$ of the voltage-current conversion circuits VIC1 and VIC2 fluctuate. Thus, the value of current flowing through each of the current mirrors CM1 to CM3 fluctuates along with the aforementioned fluctuation. This current is fed back to the adder circuit ADD2, thereby enabling the ELD compensation for a stable operation. In this configuration, the number of stages of vertically stacked transistors is small, which is only three stages including the current sources CS1 and CS2. Thus, this configuration can be said to be suitable for a circuit for low voltage operation.

Embodiment 2

Next, a description will be given of a second embodiment with reference to FIG. 5.

Figure 5:
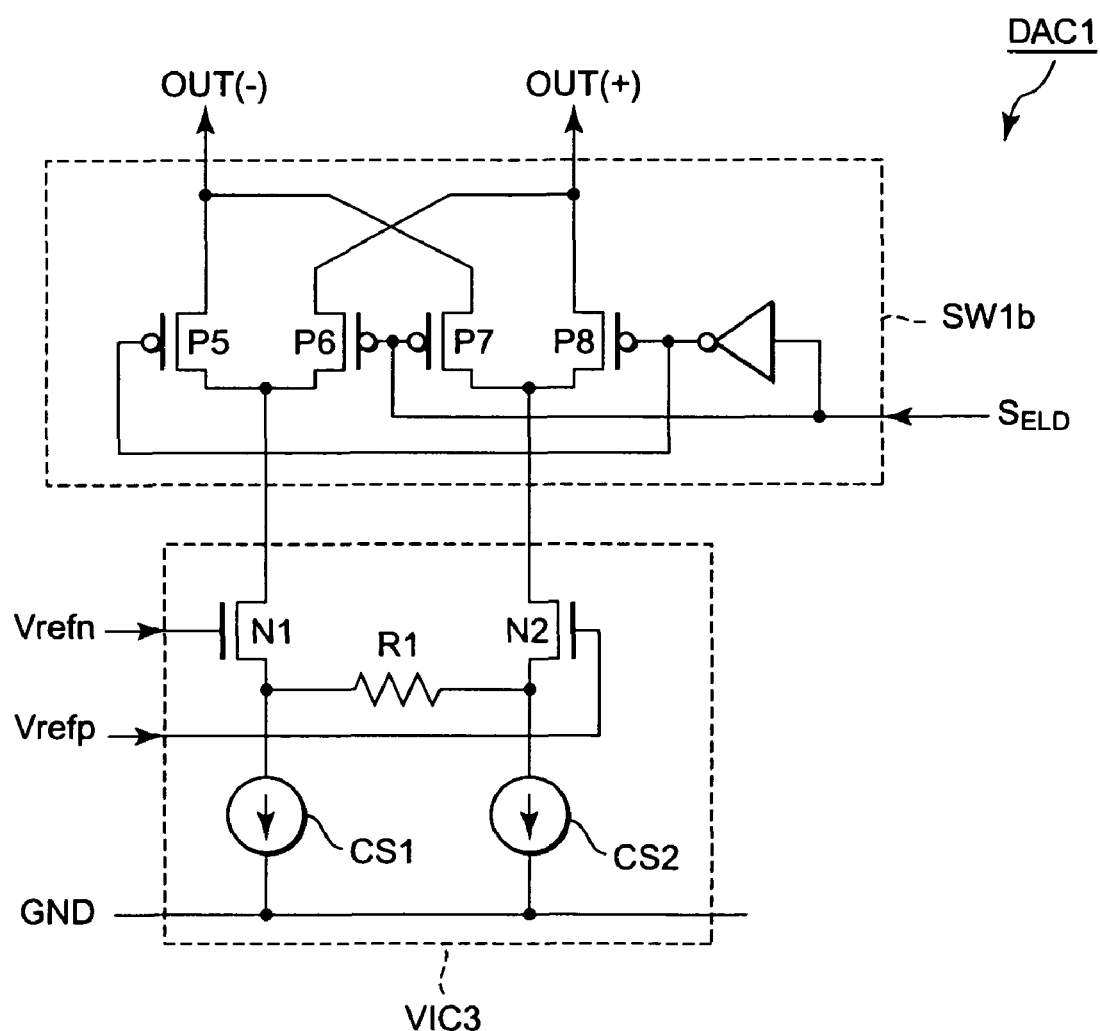
FIG. 5 is an example of a specific circuit configuration using transistors of an ELD compensation D/A converter DAC 1 according to a second embodiment.
Figure 6:
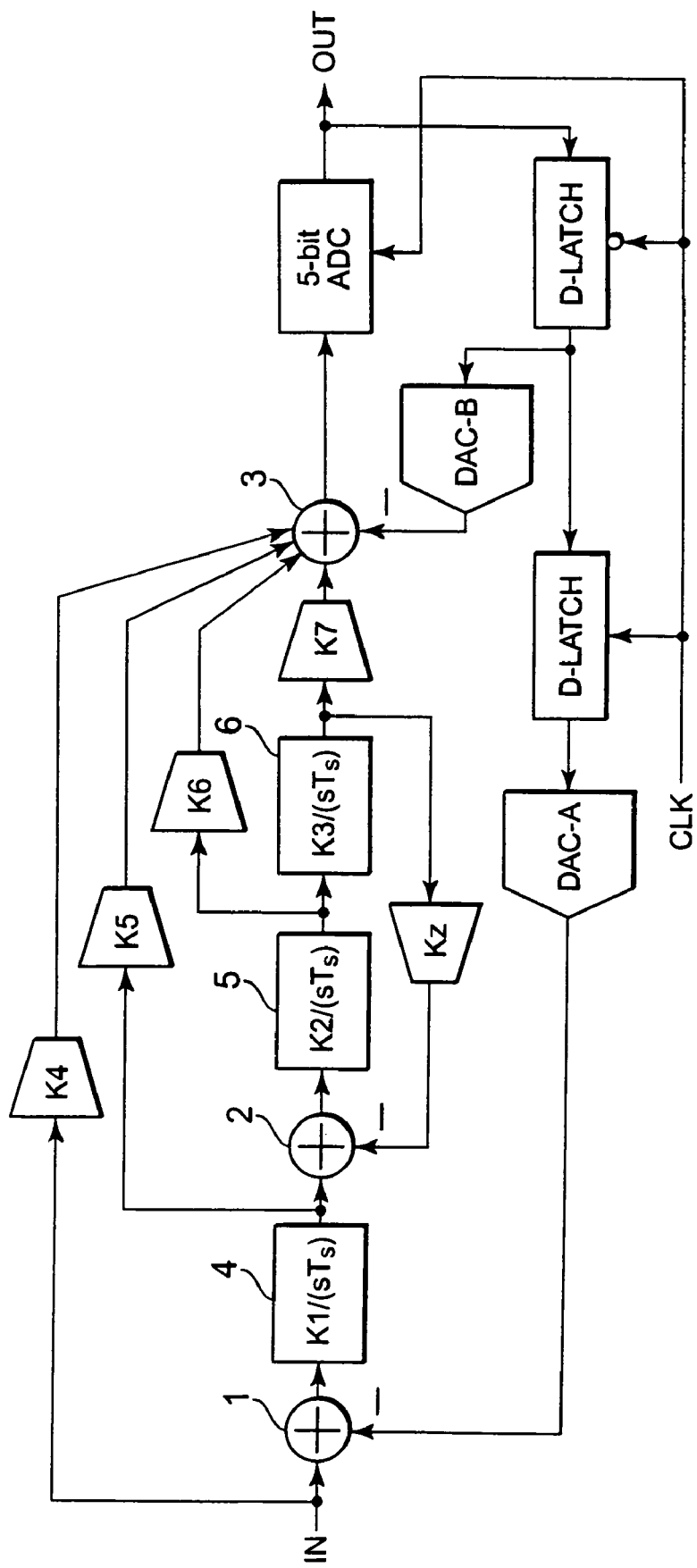
FIG. 6 is a block diagram of a continuous-time $\Delta\Sigma$ A/D converter disclosed in FIG. 2 of Non-patent Literature 1.

FIG. 5 is an example of a specific circuit configuration using transistors of an ELD compensation D/A converter DAC1 according to the second embodiment. The ELD compensation D/A converter DAC1 includes a voltage-current conversion circuit VIC3 and a differential switch circuit SW1b. As shown in FIG. 5, the voltage-current conversion circuit VIC3 has the same configuration as that of the voltage-current conversion circuit VIC3 shown in FIG. 4. Accordingly, the description of the voltage-current conversion circuit VIC3 is omitted.

The differential switch circuit SW1b is constituted of four PMOS transistors P5 to P8 and an inverter INV1. Drains of the PMOS transistors P5 and P6 are commonly connected to a drain of the NMOS transistor N1. Sources of the PMOS transistors P5 and P6 are connected to the output OUT (−) and the output OUT (+), respectively. An inverted signal of the output signal S$_{ELD}$ of the D latch DL1 by the inverter INV1 is inputted to a gate of the PMOS transistor P5. The output signal S$_{ELD}$ of the D latch DL1 is inputted to a gate of the PMOS transistor P6.

Specifically, when the output signal S$_{ELD}$ of the D latch DL1=1, the PMOS transistors P6 and P7 are turned off and the PMOS transistors P5 and P8 are turned on. On the other hand, when the output signal S$_{ELD}$ of the D latch DL1=0, the PMOS transistors P6 and P7 are turned on and the PMOS transistors P5 and P8 are turned off.

Drains of the PMOS transistors P7 and P8 are connected commonly to a drain of the NMOS transistor N2. Sources of the PMOS transistors P7 and P8 are connected to the output OUT (−) and the output OUT (+), respectively. The output signal S$_{ELD}$ of the D latch DL1 is inputted to a gate of the PMOS transistor P7. An inverted signal of the output signal $S_{ELD}$ of the D latch DL1 by the inverter INV1 is inputted to a gate of the PMOS transistor P8.

The voltage-current conversion circuit VIC3 according to the second embodiment also has the same configuration as those of the voltage-current conversion circuits VIC1 and VIC2. The differential output currents generated by the ELD reference voltages Vrefp and Vrefn are outputted from the output OUT (−) and the output OUT (+) of the ELD compensation D/A converter DAC1, respectively, by the output signal $S_{ELD}$ of the D latch DL1 without any change, or the differential output currents intersecting with each other are outputted from the output OUT (+) and the output OUT (−), respectively.

In the second embodiment as well, the conversion coefficient $g_{m3}$ of the voltage-current conversion circuit VIC3 fluctuates as the conversion coefficient $g_{m1}$ and $g_{m2}$ of the voltage-current conversion circuits VIC1 and VIC2 fluctuate. Thus, the output current difference of the voltage-current conversion circuit VIC1 fluctuates along with the aforementioned fluctuation. This output current difference is fed back to the adder circuit ADD2, thereby enabling the ELD compensation for a stable operation. The number of current paths in this configuration is reduced as compared with the configuration of FIG. 4, hence resulting in a low current. Meanwhile, in addition to the fact that the number of stages of vertically stacked transistors is three, a voltage drop due to the load resistances $R_L$ needs to be taken into consideration. Thus, as compared with the circuit configuration of FIG. 4, this configuration can be said to be suitable for a high voltage circuit.

Note that, in principle, the voltage-current conversion circuits VIC1 to VIC3 in the aforementioned first and second embodiments can be replaced with conversion circuits for converting voltage signals into voltage signals, or conversion circuits for converting current signals into current signals.

[Reference Signs List]
ADD1, ADD2 ADDER CIRCUITS
CM1 to CM3 CURRENT MIRRORS
CMP COMPARATOR
CS1, CS2 CURRENT SOURCES
DAC1 ELD COMPENSATION D/A CONVERTER
DAC2 FEEDBACK D/A CONVERTER
DL1, DL2 D LATCHES
INV1 INVERTER
N1 to N6 NMOS TRANSISTORS
P1 to P8 PMOS TRANSISTORS
R1 RESISTANCE
$R_L$ LOAD RESISTANCE
SW1, SW1a, SW1b DIFFERENTIAL SWITCH CIRCUITS
VIC1, VIC2, VIC3 VOLTAGE-CURRENT CONVERSION CIRCUITS

What is claimed is:

1. A delta sigma A/D converter comprising:
a first integration circuit to generate a first signal on the basis of an input signal and a first feedback signal from an output side;
a first signal conversion circuit to convert the first signal into a first converted signal;
a loop delay compensation circuit to generate a compensation signal and to output the compensation signal in response to a second feedback signal fed back from the output side at a timing earlier than that of the first feedback signal;
an adder circuit to add the first converted signal and the compensation signal; and
a comparator to generate a digital signal on the basis of an output signal from the adder circuit, wherein
the loop delay compensation circuit includes a compensation signal conversion circuit that generates the compensation signal, and
the compensation signal conversion circuit and the first signal conversion circuit have an approximately same rate of change in conversion coefficient depending on a temperature.

2. The delta sigma A/D converter according to claim 1, wherein
the compensation signal conversion circuit includes a first MOS transistor that receives a reference signal through a gate terminal thereof and generates the compensation signal,
the first signal conversion circuit includes a second MOS transistor that receives the first signal through a gate terminal thereof, and
a ratio between the conversion coefficients of the compensation signal conversion circuit and the first signal conversion circuit is determined on the basis of a ratio between gate widths of the first MOS transistor and the second MOS transistor.

3. The delta sigma A/D converter according to claim 2, wherein a circuit configuration of the compensation signal conversion circuit and a circuit configuration of the first signal conversion circuit are identical.

4. The delta sigma A/D converter according to claim 1, further comprising:
a second integration circuit to generate a second signal on the basis of the first signal; and
a second signal conversion circuit to convert the second signal into a second converted signal, wherein
the second signal is also added in the adder circuit, and
the compensation signal conversion circuit and the second signal conversion circuit have an approximately same rate of change in conversion coefficient depending on a temperature.

5. The delta sigma A/D converter according to claim 2, wherein the compensation signal conversion circuit is a current-voltage conversion circuit of a differential type including a pair of the first MOS transistors.

6. The delta sigma A/D converter according to claim 5, wherein the compensation signal conversion circuit further includes a first current mirror to output a difference between currents generated by the pair of the first MOS transistors, respectively.

7. The delta sigma A/D converter according to claim 6, wherein the compensation signal conversion circuit further includes a second current mirror to generate a first mirror current on the basis of the current outputted from the first current mirror.

8. The delta sigma A/D converter according to claim 7, wherein the compensation signal conversion circuit further includes a third current mirror to generate a second mirror current on the basis of the first mirror current.

9. The delta sigma A/D converter according to claim 1, further comprising:
a first latch circuit to output the second feedback signal; and
a second latch circuit to output the first feedback signal.

10. The delta sigma A/D converter according to claim 1, wherein the delta sigma A/D converter is a continuous-time type.

* * * * *